(12) United States Patent
Wong et al.

(10) Patent No.: US 9,806,158 B2
(45) Date of Patent: Oct. 31, 2017

(54) HEMT-COMPATIBLE LATERAL RECTIFIER STRUCTURE

(71) Applicant: Taiwan Semiconductor Manufacturing Co., Ltd., Hsin-Chu (TW)

(72) Inventors: King-Yuen Wong, Tuen Mun N.T. (HK); Yu-Syuan Lin, Lukang Township (TW); Chih-Wen Hsiung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 130 days.

(21) Appl. No.: 13/956,902

(22) Filed: Aug. 1, 2013

(65) Prior Publication Data

US 2015/0034958 A1   Feb. 5, 2015

(51) Int. Cl.
*H01L 29/20* (2006.01)
*H01L 29/66* (2006.01)
*H01L 29/778* (2006.01)
*H01L 29/861* (2006.01)

(52) U.S. Cl.
CPC .... *H01L 29/2003* (2013.01); *H01L 29/66462* (2013.01); *H01L 29/7787* (2013.01); *H01L 29/861* (2013.01)

(58) Field of Classification Search
None
See application file for complete search history.

(56) References Cited

U.S. PATENT DOCUMENTS

2003/0020092 A1*   1/2003   Parikh ................. H01L 29/518
                                                      257/192
2009/0032820 A1    2/2009   Chen
2009/0267078 A1*  10/2009   Mishra ............. H01L 29/66462
                                                      257/76

(Continued)

OTHER PUBLICATIONS

Saadat et al. "Gate-First AlGaN/GaN HEMT Technology for High-Frequency Applications", IEEE Electron Device Letters 30, 12, pp. 1254-1256, Dec. 2009.*

(Continued)

*Primary Examiner* — Ori Nadav
*Assistant Examiner* — Ernest Allen, III
(74) *Attorney, Agent, or Firm* — Eschweiler & Potashnik, LLC

(57) ABSTRACT

The present disclosure relates to a high electron mobility transistor compatible power lateral field-effect rectifier device. In some embodiments, the rectifier device has an electron supply layer located over a layer of semiconductor material at a position between an anode terminal and a cathode terminal. A layer of doped III-N semiconductor material is disposed over the electron supply layer. A layer of gate isolation material is located over the layer of doped III-N semiconductor material. A gate structure is disposed over layer of gate isolation material, such that the gate structure is separated from the electron supply layer by the layer of gate isolation material and the layer of doped III-N semiconductor material. The layer of doped III-N semiconductor material modulates the threshold voltage of the rectifier device, while the layer of gate isolation material provides a barrier that gives the rectifier device a low leakage.

20 Claims, 4 Drawing Sheets

(56) References Cited

U.S. PATENT DOCUMENTS

| | | | | |
|---|---|---|---|---|
| 2010/0019279 | A1* | 1/2010 | Chen | H01L 27/0605 257/194 |
| 2010/0314663 | A1* | 12/2010 | Ito | H01L 29/1083 257/192 |
| 2012/0217507 | A1* | 8/2012 | Ohki | H01L 29/2003 257/76 |
| 2012/0313106 | A1* | 12/2012 | He | H01L 29/1066 257/76 |
| 2013/0026495 | A1 | 1/2013 | Chu et al. | |
| 2013/0083567 | A1* | 4/2013 | Imada | H01L 23/4824 363/37 |
| 2013/0087803 | A1* | 4/2013 | Kizilyalli | H01L 29/66462 257/76 |
| 2013/0256684 | A1* | 10/2013 | Nishimori | H01L 29/7783 257/76 |
| 2013/0313609 | A1 | 11/2013 | Akutsu et al. | |
| 2014/0015066 | A1 | 1/2014 | Wu et al. | |
| 2014/0239309 | A1 | 8/2014 | Ramdani et al. | |
| 2014/0264365 | A1 | 9/2014 | Wong et al. | |

OTHER PUBLICATIONS

U.S. Appl. No. 14/583,391, filed Dec. 26, 2014.
Non Final Office Action Dated Dec. 16, 2015 U.S. Appl. No. 14/583,391.
Advisory Action Dated Aug. 26, 2016 U.S. Appl. No. 14/583,391.
Williams, et al. Etch Rates for Micromachining Processing—Part II Journal of Microelectromechanical Systems, vol. 12, No. 6, Dec. 2003.
Final Office Action dated Jun. 17, 2016 for U.S. Appl. No. 14/583,391.
Non-Final Office Action received on Jun. 7, 2017 in connection with U.S. Appl. No. 14/583,391.

* cited by examiner

HEMT-COMPATIBLE LATERAL RECTIFIER STRUCTURE

BACKGROUND

A power semiconductor device is a semiconductor device used as a switch or rectifier in power electronics (e.g., power converters). In comparison to low-power MOSFET devices, power semiconductor devices (e.g., power diodes, thyristors, power MOSFETs, etc.) are configured to handle larger currents and to support larger reverse bias voltages.

Conventional power semiconductor devices are formed using silicon. However, in recent years the semiconductor industry has put significant effort into developing gallium itride based power devices. Compared to conventional silicon-based power devices, GaN-based power devices feature characteristics such as lower on-resistance and the ability to perform high-frequency operations.

DETAILED DESCRIPTION

Figure 1:
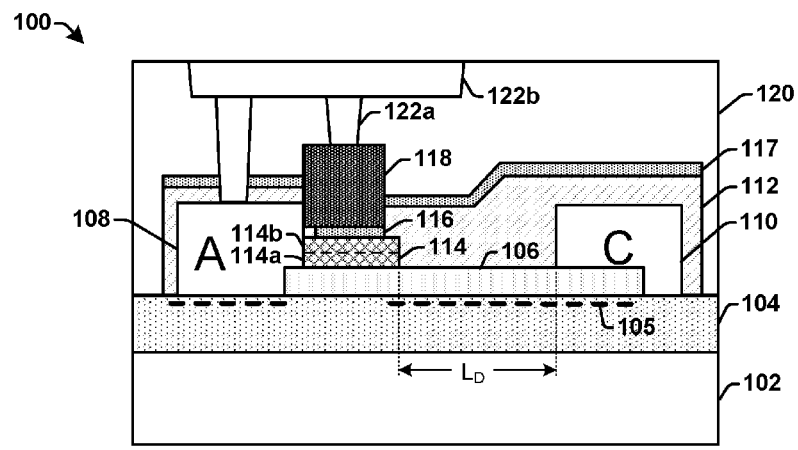
FIG. 1 illustrates a cross-sectional view of some embodiments of a high-electron mobility transistor (HEMT) compatible lateral field effect rectifier (L-FER) device

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In recent years, Gallium nitride (GaN) transistors have emerged as a promising alternative to silicon based transistors for many high power applications (e.g., power switches). GaN transistors, having aluminum gallium nitride/gallium nitride (AlGaN/GaN) heterostructures, offer a number of performance advantages over conventional silicon devices. For example, GaN semiconductors may provide a lower on-resistance and higher switching frequency than conventional silicon power devices.

Efforts have been made to provide for a two-terminal GaN power rectifier having good performance (e.g., a high reverse breakdown voltage, a low forward turn-on voltage, and a low specific on-resistance) that is compatible with a GaN HEMT (high electron mobility transistor). However, such efforts have largely failed. For example, the formation of Schottky barrier diodes and p-i-n diodes on a doped bulk GaN present high breakdown voltages and low-on resistance features, but the epitaxial structures of Schottky barrier diodes and p-i-n diodes are not compatible with the epitaxial structure of a GaN HEMT without significant performance loss (e.g., higher turn on voltages and on resistances). Alternatively, power rectifiers that are HEMT compatible have poor off leakage current, which is limited by Schottky contact reverse biasing leakage current.

Accordingly, the present disclosure relates to a high electron mobility transistor (HEMT)-compatible lateral field-effect rectifier device that provides for a high reverse breakdown voltage and low gate leakage. In some embodiments, the rectifier device comprises an electron supply layer located over a layer of semiconductor material at a position between an anode terminal and a cathode terminal. A layer of doped III-N semiconductor material is disposed over the electron supply layer. A layer of gate isolation material is located over the layer of doped III-N semiconductor material. A gate structure is disposed over gate isolation material, such that the gate structure is separated from the electron supply layer by the layer of gate isolation material and the layer of doped III-N semiconductor material. The layer of doped III-N semiconductor material modulates the threshold voltage of the rectifier device, while the layer of gate isolation material provides a barrier that provides the rectifier device with a low leakage and high reverse breakdown voltage.

FIG. 1 illustrates a cross-sectional view of some embodiments of a high-electron mobility transistor (HEMT) compatible lateral field effect rectifier (L-FER) device 100.

The L-FER device 100 comprises a layer of semiconductor material 104 disposed over a substrate 102 (e.g., a sapphire substrate, a silicon substrate, silicon carbide substrate, etc.). In some embodiments, the layer of semiconductor material 104 may comprise a III-V semiconductor material or a III-nitride (III-N) semiconductor material. For example, in some embodiments wherein the L-FER device 100 comprises a gallium nitride rectifier device, the layer of semiconductor material 104 may comprise a gallium nitride (GaN) layer (e.g., an unintentionally doped GaN layer having a doping resulting from process contaminants).

An electron supply layer 106 is located over the layer of semiconductor material 104 at a position between anode and cathode terminals, 108 and 110, respectively comprising ohmic contact regions disposed over the layer of semiconductor material 104. The electron supply layer 106 comprises a material having a band gap unequal to (e.g., larger than) that of the underlying layer of semiconductor material 104 so that a heterojunction, which serves as a channel region of the HEMT compatible L-FER device 100, is located along an interface of the layer of semiconductor material 104 and electron supply layer 106. The heterojunction causes the electron supply layer 106 to supply charge carriers (e.g., electrons) to a two-dimensional electron gas (2-DEG) 105 located along the interface. The 2-DEG 105 has high mobility electrons that are free to move between the anode terminal 108 and the cathode terminal 110. In some embodiments, the electron supply layer 106 comprises aluminum gallium nitride (AlGaN). In some embodiments, a thin film of AlGaN may be intentionally doped to have a doping that provides carriers to the 2-DEG 105.

A layer of insulating material 112 may be disposed over the anode terminal 108, the cathode terminal 110, and a portion of the electron supply layer 106. In some embodiments, the layer of insulating material 112 may comprise silicon nitride ($Si_3N_4$), for example.

A layer of doped III-N semiconductor material 114 is positioned over the electron supply layer 106. The layer of doped III-N semiconductor material 114 is separated from the cathode terminal 110 by a drift length $L_D$. The layer of doped III-N semiconductor material 114 may comprise a p-type doping and/or an n-type doping in various embodiments. In some embodiments, the layer of doped III-N semiconductor material 114 is laterally disposed between the layer of insulating material 112 and the anode terminal 108. The layer of doped III-N semiconductor material comprises gallium-nitride (GaN). In some embodiments, the GaN may comprise a bottom layer of GaN 114a having a first doping type (e.g., a p-type doping) and a top layer of GaN 114b, overlying the bottom layer of GaN 114b and having a second doping type (e.g., an n-type doping) different than the first doping type.

A layer of gate isolation material 116 is located over the layer of doped III-N semiconductor material 114. In some embodiments, the layer of gate isolation material 116 may comprise silicon dioxide ($SiO_2$), silicon nitride ($Si_3N_4$), gallium oxide ($Ga_2O_3$), aluminum oxide ($Al_2O_3$), scandium oxide ($Sc_2O_3$), hafnium oxide ($HfO_2$), or aluminum nitride (AlN), for example. In various embodiments, the layer of gate isolation material 116 may have a thickness in a range of between approximately 5 angstroms and approximately 30 angstroms. In some embodiments, a layer of isolation material 117 may be located over the layer of insulating material 112. The layer of isolation material 117 may be the same material as the layer of gate isolation material 116 and/or may have a same thickness as the layer of gate isolation material 116. The layer of gate isolation material 116 suppresses gate leakage current, thereby improving gate stability, providing the L-FER device 100 with a low turn-on voltage, a low on-resistance, and a high breakdown reverse voltage.

A gate structure 118 is located over the gate isolation material 116 at a position overlying the layer of doped III-N semiconductor material 114, such that the layer of gate isolation material 116 separates the gate structure 118 from the underlying doped III-N semiconductor material 114. In some embodiments, the gate structure 118 may comprise a metal gate structure. For example, the gate structure 118 may comprise one or more of titanium (Ti), nickel (Ni), aluminum (Al), nickel aluminum (NiAl), or tungsten (W), tungsten nitride (WN), or some combination thereof, for example. In various embodiments, the gate structure 118 may have a thickness in a range of between approximately 1,000 angstroms and approximately 5,000 angstroms.

A dielectric material 120 is disposed over the substrate at a position overlying the gate structure 118. The dielectric material 120 may comprise a low-k inter-level dielectric material such as silicon dioxide ($SiO_2$), silicon carbide doped oxide (SiCO), etc. The dielectric material 120 comprises one or more metal interconnect layers 122 configured to provide an electrical connection to the anode terminal 108, the cathode terminal 110, and gate structure 118 of the L-FER device 100. In some embodiments, the one or more metal interconnect layers 122 may comprise one or more metal vias 122a configured to provide a vertical connection and one or more metal wires 122b configured to provide a lateral connection.

The one or more metal interconnect layers 122 are configured to electrically couple the gate structure 118 to the anode terminal 108. By connecting the gate structure 118 to the anode terminal 108, the three terminal device (the anode terminal 108, the cathode terminal 110 and the gate structure 118) is converted to a two terminal lateral rectifier having a drift length $L_D$, thereby allowing the forward turn-on voltage of the L-FER device 100 to be determined by the threshold voltage of the channel (rather than the Schottky barrier of the anode terminal 108). During operation, the one or more metal interconnect layers 122 may be operated to bias the L-FER device 100 in a forward bias mode of operation or in a reverse bias mode of operation. For example, applying a forward bias to the gate structure 118 causes the channel to turn on, while applying a reverse bias to the gate structure 118 causes the channel to turn off.

Figure 2:
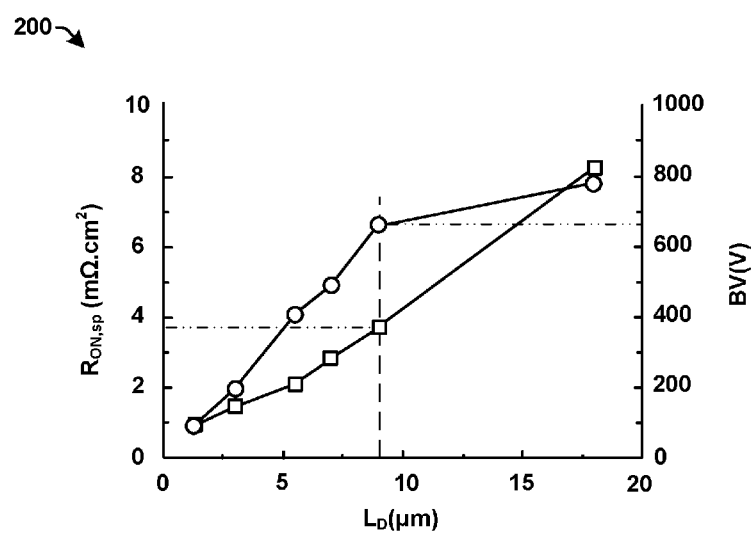
FIG. 2 illustrates a graph showing performance parameters of some embodiments of a disclosed HEMT compatible gallium-nitride (GaN) rectifier device.

FIG. 2 illustrates a graph 200 showing performance parameters of some embodiments of a disclosed HEMT compatible gallium-nitride (GaN) lateral rectifier device. A first y-axis illustrates the on-resistance (i.e., resistance drain to source) vs. the drift length $L_D$ (x-axis). A second y-axis illustrates the breakdown voltage vs. the draft length $L_D$ (x-axis).

As illustrated in graph 200, at a drift length $L_D$ of 9 um, the GaN lateral rectifier device exhibits a reverse breakdown voltage of 660 V and an on-resistance $R_{on,sp}$ of 3.72 mOhm*cm$^2$. The resulting power figure of merit ($BV^2/R_{on,sp}$) is 117 MW*cm$^{-2}$, which is comparable to state-of-art GaN rectifiers that are not compatible with HEMT.

Figure 3:
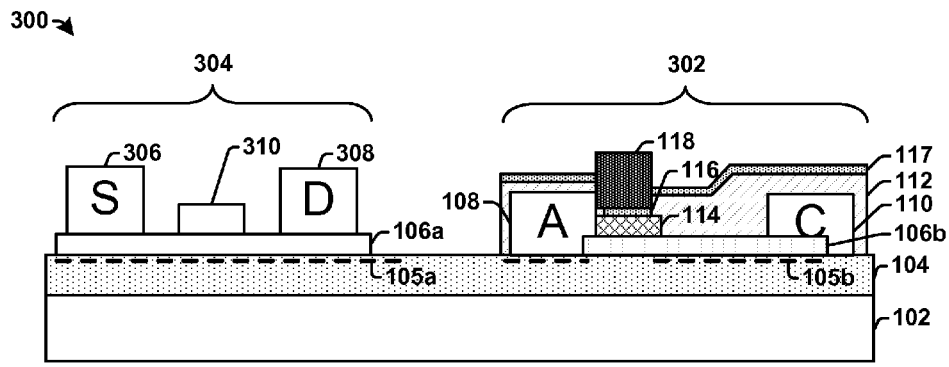
FIG. 3 illustrates a cross-sectional view of some embodiments of an integrated chip comprising a disclosed L-FER integrated with a normally-off HEMT.

FIG. 3 illustrates a cross-sectional view of some embodiments of an integrated chip 300 comprising a disclosed L-FER 302 integrated with a normally-off HEMT 304.

The L-FER 302 is described above in relation to FIG. 1. The normally off HEMT 304 comprises a source terminal 306, a drain terminal 308, and a gate structure 310, disposed over a heterojunction (e.g., an AlGaN/GaN heterojunction). As shown, the L-FER 302 and the normally-off HEMT 304 share a common epitaxial layer of semiconductor material 104 formed over substrate 102. In some embodiments, the L-FER 302 and the normally-off HEMT 304 may be manufactured as an integrated structure (e.g., on a same integrated chip) using a same fabrication process.

Figure 4:
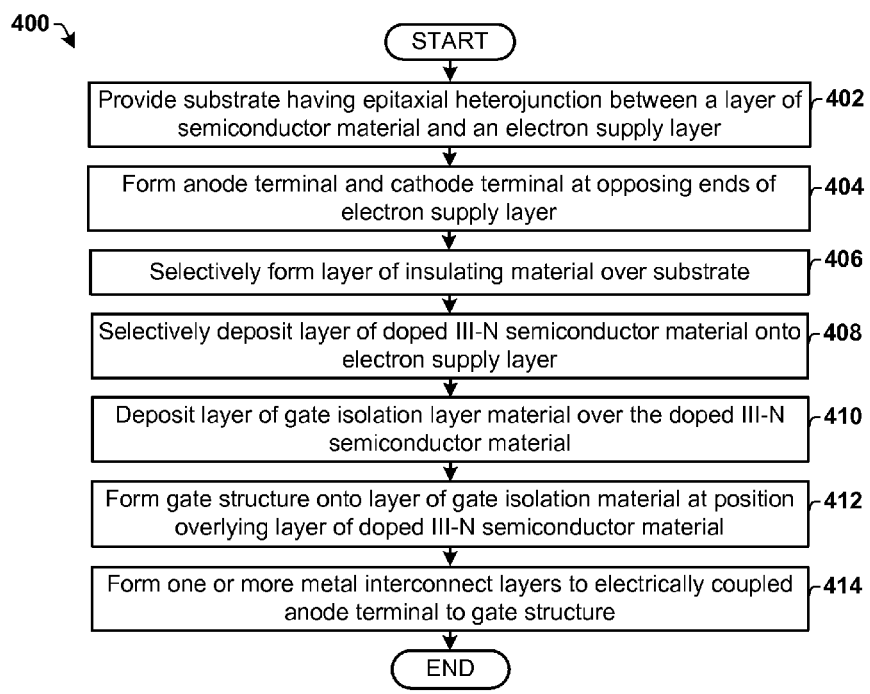
FIG. 4 illustrates a flow diagram of some embodiments of a method of forming a HEMT compatible lateral field effect rectifier (L-FER) device.

FIG. 4 illustrates a flow diagram of some embodiments of a method 400 for forming a HEMT compatible lateral field effect rectifier (L-FER) device.

While disclosed method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a substrate having an epitaxial heterojunction, between a layer of semiconductor material and an electron supply layer, is provided. In some embodiments, the substrate comprises a layer of semiconductor material (e.g., a III-V semiconductor material) and an overlying electron supply layer, epitaxial grown over a substrate (e.g., a sapphire substrate, a silicon substrate, silicon carbide substrate, etc.). The layer of semiconductor material and the electron supply layer have different bandgaps, resulting in the formation of the heterojunction.

At 404, an anode terminal and a cathode terminal are formed at opposing ends of the electron supply layer. The anode and cathode terminals comprise ohmic contact regions.

At 406, a layer of insulating material is selectively formed over the substrate at a position overlying the anode terminal, the cathode terminal, and/or a portion of the electron supply layer.

At 408, a layer of doped III-N semiconductor material is selectively formed onto electron supply layer. In some embodiments, the layer of doped III-N semiconductor material may comprise a doped gallium nitride (GaN) material having a p-type doping and/or an n-type doping.

At 410, a layer of gate isolation material is formed over the layer of doped III-N semiconductor material.

At 412, a gate structure is formed over the layer of gate isolation material at a position overlying the layer of doped III-N semiconductor material.

At 414, one or more metal interconnect layers are formed to electrically couple the anode terminal and the gate structure.

FIGS. 5-8 illustrate some embodiments of cross-sectional views of a substrate upon which a method forming a lateral field effect rectifier (L-FER) device, corresponding to method 400, is performed. Although FIGS. 5-8 are described in relation to method 400, it will be appreciated that the structures disclosed in FIGS. 5-8 are not limited to such a method, but instead may stand alone as a structure.

Figure 5:
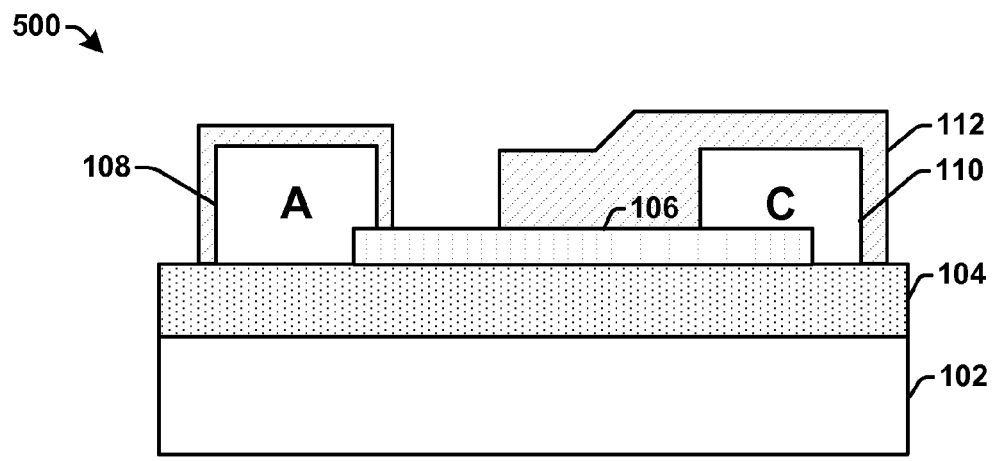
FIGS. 5-8 illustrate cross-sectional views of some embodiments of an example substrate upon which a method of forming a HEMT compatible lateral field effect rectifier (L-FER) device is performed.

FIG. 5 illustrates a cross-sectional view 500 of some embodiments of a substrate corresponding to acts 402-406.

As shown in cross-sectional view 500, a layer of semiconductor material 104 and an electron supply layer 106 are epitaxially grown over a substrate 102 (e.g., silicon, silicon carbide, sapphire, etc.). The layer of semiconductor material 104 and the electron supply layer 106 have different bandgaps, thereby forming an epitaxial heterojunction. In some embodiments, the layer of semiconductor material 104 comprises a gallium-nitride (GaN) layer and the electron supply layer 106 comprises an aluminum gallium nitride (AlGaN) layer.

An anode terminal 108 and a cathode terminal 110 are formed at opposing ends of the electron supply layer 106. In some embodiments, the anode terminal 108 and the cathode terminal 110 may be formed by depositing a metal (e.g., tungsten, aluminum, etc.) onto the underlying layer of semiconductor material 104 by way of a deposition technique (e.g., chemical vapor deposition, physical vapor deposition, etc.) and selectively etching the deposited metal. A layer of insulating material 112 is subsequently formed at a position overlying the anode terminal, 108, the cathode terminal 110, and a portion of the electron supply layer 106. In some embodiments, the layer of insulating material 112 may comprise silicon nitride (SiN) deposited by a vapor deposition technique.

Figure 6:
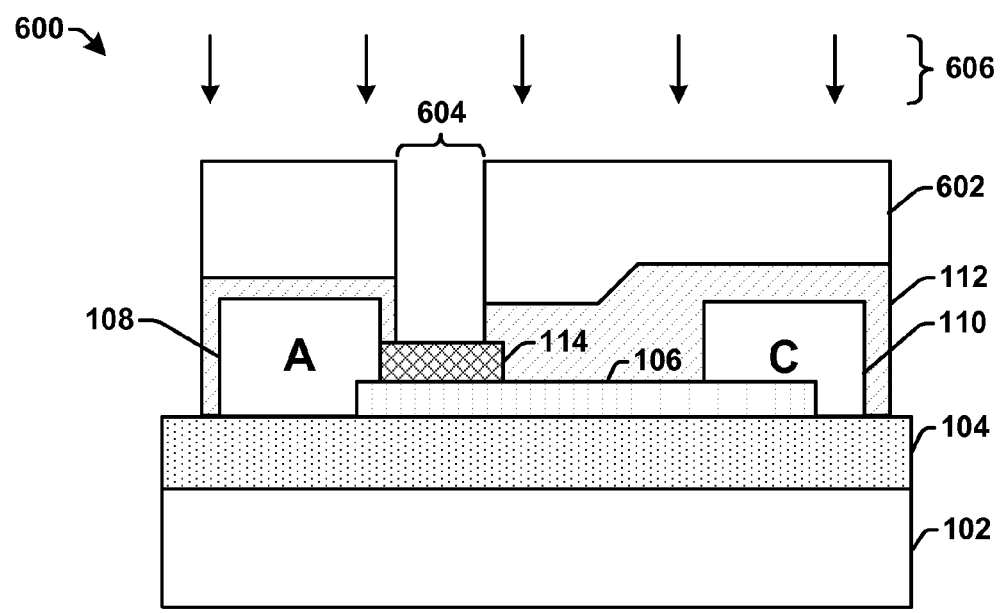

FIG. 6 illustrates a cross-sectional view 600 of some embodiments of a substrate corresponding to act 408. As shown in cross-sectional view 600, a layer of doped III-N semiconductor material 114 (e.g., GaN) is selectively formed onto the electron supply layer 106. In some embodiments, the layer of doped III-N semiconductor material 114 may be selectively formed by first forming a masking layer 602 is over the layer of insulating material 112. The masking layer 602 comprises an opening 604 at a position in which a gate structure is to be subsequently formed. The layer of insulating material 112 is then selectively exposed to an etchant 606 that removes a portion of the layer of insulating material 112 to expose the underlying electron supply layer 106.

In some embodiments, the etchant 606 may comprise a plasma etchant (e.g., an inductively coupled plasma reactive ion etchant in which high energy ions etch away the layer of insulating material 112). For example, the etchant 606 may be generated by a RIE plasma dry etching process performed within a low pressure etching chamber. The layer of doped III-N semiconductor material 114 is subsequently formed by epitaxial growth onto the electron supply layer 106. The layer of doped III-N semiconductor material 114 may have a thickness and doping that can be selected to have a value that tunes the threshold voltage of the L-FER device.

In some embodiments, the layer of doped III-N semiconductor material 114 may comprise a layer of n/p gallium nitride (GaN). The layer of n/p GaN comprises a first layer of GaN having a first doping type (e.g., an n-type doping) disposed onto the electron supply layer 106, and a second layer of GaN having a second doping type (e.g., a p-type doping) disposed onto the first layer of GaN. For example, the layer of n/p GaN may comprise a bottom layer of GaN having a a p-type doping and an overlying top layer of GaN having an n-type doping.

Figure 7:
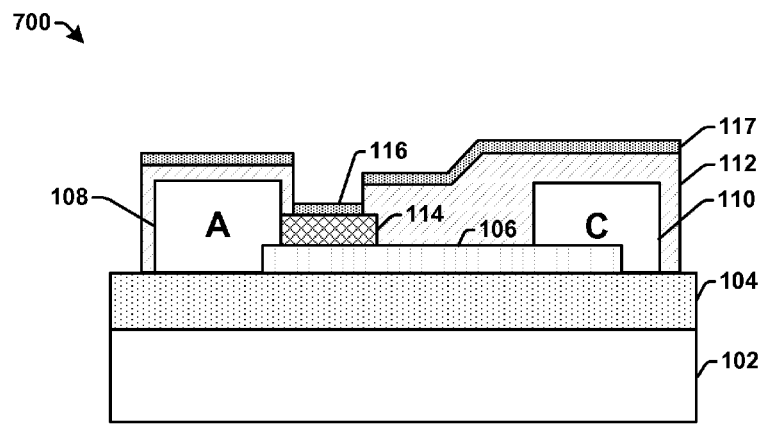

FIG. 7 illustrates a cross-sectional view 700 of some embodiments of a substrate corresponding to act 410. As shown in cross-sectional view 700, a layer of gate isolation material 116 is formed over the layer of doped III-N semiconductor material 114. In some embodiments, the layer of isolation material 117 may also be formed over the layer of insulating material 112. In such embodiments, the layer of gate isolation material 116 and the layer of isolation material 117 may be formed (e.g., deposited) as a same layer of material. The layer of gate isolation material 116 provides a barrier between a subsequently formed gate structure (118) and the layer of doped III-N semiconductor material 114, thereby decreasing gate leakage. The layer of gate isolation material 116 also prevents diffusion of atoms from a subsequently formed gate structure (118) to the underlying layer of doped III-N semiconductor material 114 during BEOL thermal processes used in formation of the one or more interconnect layers.

The layer of gate isolation material 116 may be deposited by way of a vapor deposition process (e.g., atomic layer deposition (ALD), chemical vapor deposition (CVD), or physical vapor deposition (PVD)) to a thickness in a range of between approximately 5 angstroms and approximately 30 angstroms. In some embodiments, the layer of gate isolation material 116 may comprise silicon dioxide ($SiO_2$), silicon nitride ($Si_3N_4$), gallium oxide ($Ga_2O_3$), aluminum oxide ($Al_2O_3$), Scandium oxide ($Sc_2O_3$), hafnium oxide ($HfO_2$), or aluminum nitride (AlN), for example.

Figure 8:
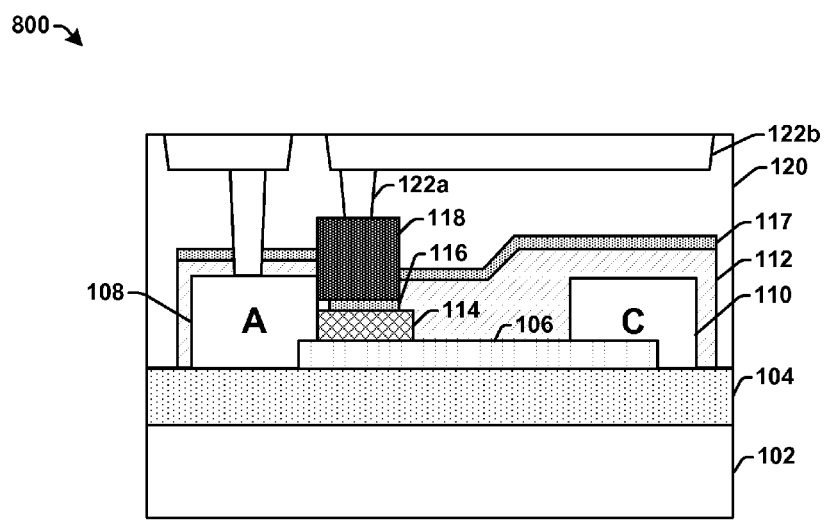

FIG. 8 illustrates a cross-sectional view 800 of some embodiments of a substrate corresponding to acts 412-414. As shown in cross-sectional view 800, a gate structure 118 is formed directly onto of the layer of gate isolation material 116. The gate structure 118 may be formed by depositing a metal (e.g., Ti, Ni, Al, NiAl, W, WN, etc.) using sputtering or physical vapor deposition, for example. The metal is then selectively etched to remove a part of the metal and to define a gate structure 118.

One or more metal interconnect layers 122 are then formed. The one or more metal interconnect layers 122 are configured to short the anode terminal 108 to the gate structure 118. By connecting the anode terminal 108 to the gate structure, the three terminal device is converted to a two terminal lateral rectifier. In some embodiments, the one or more metal interconnect layers 122 may be formed by depositing a dielectric material 120 over the substrate and selectively etching the dielectric material 120 to form one or more trenches. The trenches are subsequently filled with a metal to form the one or more metal interconnect layers 122.

It will be appreciated that while reference is made throughout this document to exemplary structures in discussing aspects of methodologies described herein (e.g., the structure presented in FIGS. 5-8, while discussing the methodology set forth in FIG. 4), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a high electron mobility transistor (HEMT)-compatible power lateral field-effect rectifier (L-FER) device that provides for a high-mobility and low gate leakage.

In some embodiments, the present disclosure relates to a high electron mobility transistor (HEMT)-compatible power lateral field-effect rectifier (L-FER) device. The L-FER device comprises a layer of semiconductor material disposed over a substrate and an electron supply layer disposed over the layer of semiconductor material at a position between an anode terminal and a cathode terminal. The L-FER device further comprises a layer of doped III-nitride (III-N) semiconductor material disposed over the electron supply layer. The L-FER device further comprises a gate structure disposed over the layer of doped III-N semiconductor material, such that the gate structure is separated from the electron supply layer by the layer of doped III-N semiconductor material. The L-FER device further comprises one or more metal interconnect layers configured to electrically couple the gate structure to the anode terminal.

In other embodiments, the present disclosure relates to a lateral field-effect rectifier (L-FER) device. The L-FER device comprises a layer of semiconductor material disposed over a substrate and an electron supply layer disposed over the layer of semiconductor material at a position between an anode terminal and a cathode terminal. The L-FER device further comprises a layer of doped III-nitride (III-N) semiconductor material disposed over the electron supply layer. The L-FER device further comprises a layer of gate isolation material disposed over the layer of doped III-N semiconductor material. The L-FER device further comprises a gate structure disposed over the layer of gate isolation material, such that the gate structure is separated from the electron supply layer by the layer of gate isolation material and the layer of doped III-N semiconductor material. The L-FER device further comprises one or more metal interconnect layers configured to electrically couple the gate structure to the anode terminal.

In yet other embodiments, the present disclosure relates to a method of forming a lateral field effect rectifier (L-FER) device. The method comprises providing a substrate having an epitaxial heterojunction between a layer of semiconductor material and an electron supply layer. The method further comprises forming an anode terminal and a cathode terminal comprising ohmic contact regions at opposing ends of the electron supply layer. The method further comprises selectively forming a layer of doped III-N material is onto electron supply layer. The method further comprises forming a gate structure at a position overlying the layer of doped III-N material. The method further comprises forming one or more metal interconnect layers to electrically couple the gate structure and the anode terminal.

What is claimed is:

1. A high electron mobility transistor (HEMT)-compatible power lateral field-effect rectifier (L-FER) device, comprising:
   a layer of semiconductor material disposed over a substrate;
   an electron supply layer disposed over the layer of semiconductor material at a position between an anode terminal and a cathode terminal;
   a layer of doped III-nitride (III-N) semiconductor material disposed over the electron supply layer;
   a layer of insulating material arranged on the electron supply layer at a location laterally between the cathode terminal and the layer of doped III-N semiconductor material and further arranged vertically over the cathode terminal,
   wherein the layer of insulating material is laterally between the cathode terminal and the layer of doped III-N semiconductor material and wherein the layer of insulating material has an upper surface, facing away from the substrate, which is over a top surface of the layer of doped III-N semiconductor material;
   a gate structure disposed over the layer of doped III-N semiconductor material, such that the gate structure is separated from the electron supply layer by the layer of doped III-N semiconductor material;
   one or more metal interconnect layers configured to electrically couple the gate structure to the anode terminal;
   a layer of gate isolation material disposed between the layer of doped III-N semiconductor material and the gate structure;
   a layer of isolation material arranged on and in contact with a top surface of the layer of insulating material and having a non-planar upper surface facing away from the substrate, wherein the layer of isolation material comprises a same material as the layer of gate isolation material; and
   an inter-level dielectric (ILD) layer arranged on and in direct contact with top surfaces of the layer of isolation material and the gate structure and contacting sidewalls of the layer of insulating material and the layer of isolation material.

2. The L-FER of claim 1, wherein the layer of doped III-N semiconductor material comprises:

a bottom layer of gallium-nitride (GaN) having a first doping type that is a p-type doping or an n-type doping; and a top layer of GaN arranged on and in direct contact with a top surface of the bottom layer of GaN, and having a second doping type that is the p-type doping or the n-type doping, wherein the second doping type is different than the first doping type.

3. The L-FER of claim 1, wherein the layer of insulating material comprises silicon nitride ($Si_3N_4$).

4. A lateral field-effect rectifier (L-FER) device, comprising:

a layer of semiconductor material disposed over a substrate;

an electron supply layer disposed over the layer of semiconductor material at a position between an anode terminal and a cathode terminal;

a layer of doped III-nitride (III-N) semiconductor material disposed over the electron supply layer and contacting a sidewall of the anode terminal, wherein the layer of doped III-N semiconductor material has a bottommost surface at a higher level than a bottommost surface of the anode terminal;

a layer of gate isolation material disposed over the layer of doped III-N semiconductor material;

a gate structure disposed over the layer of gate isolation material, such that the gate structure is separated from the electron supply layer by the layer of gate isolation material and the layer of doped III-N semiconductor material;

one or more metal interconnect layers configured to electrically couple the gate structure to the anode terminal;

a layer of insulating material arranged on the electron supply layer at a location laterally between the cathode terminal and the layer of doped III-N semiconductor material and further arranged vertically over the cathode terminal;

a layer of isolation material arranged on and in contact with a top surface of the layer of insulating material and having a non-planar upper surface facing away from the substrate, wherein the layer of isolation material comprises a same material as the layer of gate isolation material; and an ILD layer arranged on and in direct contact with top surfaces of the layer of isolation material and the gate structure and contacting sidewalls of the layer of insulating material and the layer of isolation material.

5. The L-FER of claim 4, wherein the layer of doped III-N semiconductor material comprises:

a bottom layer of gallium-nitride (GaN) having a first doping type that is a p-type doping or an n-type doping; and a top layer of GaN arranged on and in direct contact with a top surface of the bottom layer of GaN, and having a second doping type that is the p-type doping or the n-type doping, wherein the second doping type is different than the first doping type.

6. The L-FER of claim 4, wherein the layer of insulating material comprises silicon nitride ($Si_3N_4$) contacting the anode terminal, the cathode terminal, and a portion of the electron supply layer.

7. The L-FER of claim 6, wherein the layer of doped III-N semiconductor material is laterally disposed between the layer of insulating material and the anode terminal and extends past an outermost sidewall of the gate structure.

8. A high electron mobility transistor (HEMT)-compatible power lateral field-effect rectifier (L-FER) device, comprising:

a layer of III-V semiconductor material disposed over a substrate;

an electron supply layer disposed vertically over the layer of III-V semiconductor material at a position laterally between an anode terminal and a cathode terminal, and having a lower surface that is aligned along a horizontal plane with lower surfaces of the anode terminal and the cathode terminal, wherein the electron supply layer contacts horizontal and vertical surfaces of both the anode terminal and the cathode terminal;

a layer of doped III-nitride (III-N) semiconductor material arranged on and in direct contact with the electron supply layer;

a layer of gate isolation material on and in direct contact with the layer of doped III-N semiconductor material;

a gate structure separated from the electron supply layer by the layer of doped III-N semiconductor material and the layer of gate isolation material;

a layer of insulating material arranged on the electron supply layer at a location laterally between the cathode terminal and the layer of doped III-N semiconductor material and further arranged over the cathode terminal;

a layer of isolation material arranged on and in contact with a top surface of the layer of insulating material and having a non-planar upper surface facing away from the substrate, wherein the layer of isolation material comprises a same material as the layer of gate isolation material; and an inter-level dielectric (ILD) layer arranged on and in direct contact with top surfaces of the layer of isolation material and the gate structure and contacting sidewalls of the layer of insulating material and the layer of isolation material.

9. The L-FER of claim 8, wherein the layer of insulating material contacts an upper surface and a sidewall of the anode terminal, an upper surface and a sidewall of the cathode terminal, and an upper surface of the electron supply layer.

10. The L-FER of claim 1, wherein the layer of insulating material contacts an upper surface of the electron supply layer and a sidewall of the layer of gate isolation material.

11. The L-FER of claim 1, wherein the ILD layer extends from over the cathode terminal to an upper surface of the gate structure, and wherein ILD layer is laterally separated from the electron supply layer by the cathode terminal and the layer of insulating material.

12. The L-FER of claim 1, wherein the electron supply layer has a lower surface that is aligned along a horizontal plane with lower surfaces of the anode terminal and the cathode terminal.

13. The L-FER of claim 1, wherein a bottom of the cathode terminal has a stepped structure comprising a first horizontal surface contacting the electron supply layer, a vertical surface connected to the first horizontal surface and contacting the electron supply layer, and a second horizontal surface connected to the vertical surface and contacting the layer of semiconductor material.

14. The L-FER of claim 1, wherein the electron supply layer contacts horizontal and vertical surfaces of both the anode terminal and the cathode terminal.

15. The L-FER of claim 4, wherein the anode terminal contacts a first sidewall and an upper surface of the electron supply layer, and the cathode terminal contacts a second sidewall and an upper surface of the electron supply layer.

16. The L-FER of claim 4, wherein the anode terminal, the cathode terminal, and the electron supply layer contact an upper surface of the layer of semiconductor material.

17. The L-FER of claim 1, wherein the layer of isolation material contacts opposing sidewalls of the gate structure.

18. The L-FER of claim 1, wherein the layer of doped III-N semiconductor material laterally extends past an outermost sidewall of the gate structure.

19. The L-FER of claim 1, wherein the electron supply layer extends a first horizontal distance below the anode terminal and a second horizontal distance below the cathode terminal, wherein the first horizontal distance is less than the second horizontal distance.

20. The L-FER of claim 4, wherein a first side of the electron supply layer is laterally separated from the layer of isolation material by the anode terminal and a second side of the electron supply layer is laterally separated from the layer of isolation material by the cathode terminal.

* * * * *